United States Patent
Gardner et al.

[11] Patent Number: 6,080,629
[45] Date of Patent: Jun. 27, 2000

[54] ION IMPLANTATION INTO A GATE ELECTRODE LAYER USING AN IMPLANT PROFILE DISPLACEMENT LAYER

[75] Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 08/837,579

[22] Filed: Apr. 21, 1997

[51] Int. Cl.$^7$ .................................................. K01L 21/336
[52] U.S. Cl. .......................... 438/301; 438/303; 438/305
[58] Field of Search ..................................... 438/301, 303, 438/305, 162

[56] References Cited

U.S. PATENT DOCUMENTS

| | | | |
|---|---|---|---|
| 4,369,072 | 1/1983 | Bakeman, Jr. et al. | 148/1.5 |
| 4,420,872 | 12/1983 | Solo de Zaldivar | 29/571 |
| 4,481,527 | 11/1984 | Chen et al. | 357/23 |
| 4,575,921 | 3/1986 | Bhagat | 29/571 |
| 4,597,159 | 7/1986 | Usami et al. | 29/571 |
| 4,774,197 | 9/1988 | Haddad et al. | 437/27 |
| 4,869,781 | 9/1989 | Euen et al. | 156/643 |
| 4,897,368 | 1/1990 | Kobushi et al. | 437/200 |
| 5,518,958 | 5/1996 | Giewont et al. | 437/186 |
| 5,567,638 | 10/1996 | Lin et al. | 437/46 |
| 5,605,848 | 2/1997 | Ngaoaram | 437/24 |
| 5,879,975 | 3/1999 | Karlsson et al. | 538/162 |
| 5,885,877 | 3/1999 | Gardner et al. | 438/300 |

OTHER PUBLICATIONS

Silicon Processing for the VLSI Era—vol. 1: Process Technology, by S. Wolf, published by Lattice Press, Sunset Beach, CA, 1986, pp. 182–195, 209–211, 280–283, 294, 308, 321–327.

Silicon Processing for the VLSI Era—vol. 3: The Submicron MOSFET, by S. Wolf, published by Lattice Press, Sunset Beach, CA, 1995, pp. 641–642.

A. B. Joshi, J. Ahn, and D. L. Kwong; "Oxynitride Gate Dielectrics for p+–Polysilicon Gate MOS Devices," *IEEE Electron Devices Letters*, vol. 14, No. 12, Dec. 1993, pp. 560–562.

H. Fang et al., "Low–Temperature Furnace–Grown Reoxidized Nitrided Oxide Gate Dielectrics as a Barrier to Boron Penetration," *IEEE Electron Device Letters*, vol. 13, No. 4, Apr. 1992, pp. 217–219.

Chuan Lin et al, "Leakage Current, Reliability Characteristics, and Boron Penetration of Ultra–Thin (32–36Å) $O_2$–Oxides and $N_2O$/NO Oxynitrides," *International Electron Devices Meeting Technical Digest*, Dec. 8–11, 1996, San Francisco, CA, pp. 331–334.

E. Hasegawa et al, "The Impact of Nitrogen Profile Engineering On Ultra–Thin Nitrided Oxide Films for Dual–Gate CMOS ULSI," *International Electron Devices Meeting Technical Digest*, Dec. 10–13, 1995, Washington, DC, pp. 327–330.

(List continued on next page.)

*Primary Examiner*—John F. Niebling
*Assistant Examiner*—Michael S. Lebentritt
*Attorney, Agent, or Firm*—Skjerven, Morrill, MacPherson, Franklin & Friel, L.L.P.

[57] ABSTRACT

A method for implanting a dopant into a thin gate electrode layer includes forming a displacement layer on the gate electrode layer to form a combined displacement/gate electrode layer, and implanting the dopant into the combined layer. The implanted dopant profile may substantially reside entirely within the gate electrode layer, or may substantially reside partially within the gate electrode layer and partially within the displacement layer. If the displacement layer is ultimately removed, at least some portion of the implanted dopant remains within the gate electrode layer. The gate electrode layer may be implanted before or after patterning and etching the gate electrode layer to define gate electrodes. Moreover, two different selective implants may be used to define separate regions of differing dopant concentration, such as P-type polysilicon and N-type polysilicon regions. Each region may utilize separate displacement layer thicknesses, which allows dopants of different atomic mass to use similar implant energies. A higher implant energy may be used to dope a gate electrode layer which is much thinner than normal range statistics require, without implant penetration into underlying structures.

38 Claims, 5 Drawing Sheets

OTHER PUBLICATIONS

S. V. Hattangady, H. Niimi, and G. Lucovsky, "Controlled Nitrogen Incorporation at the Gate Oxide Surface," *Applied Physics Letters*, vol. 66, No. 25, Jun. 19, 1995, pp. 3495–3497.

Stanley Wolf, *Silicon Processing for the VLSI Era, vol. 2: Process Integration*, Lattice Press, Sunset Beach, CA, 1990, pp. 124–131. Month Unknown.

T. Kuroi et al., "Novel NICE (Nitrogen Implantation into CMOS Gate Electrode and Source–Drain) Structure for High Reliability and High Performance 0.25 µm Dual gate CMOS," *International Electron Devices Meeting Technical Digest*, Dec. 5–8, 1993, Washington, D.C., pp. 325–328.

Stanley Wolf, *Silicon Processing for the VLSI Era, vol. 3: The Submicron MOSFET*, Latttice Press, Sunset Beach, CA, 1995, pp. 305–313, 496–504, and 648–661. Month Unknown.

H. Sayama et al, "Low Voltage of Sub–Quarter Micron W–Polycide Dual Gate CMOS with Non–Uniformly Doped Channel," *International Electron Devices Meeting Technical Digest*, Dec. 8–11, 1996, San Francisco, CA, pp. 583–586.

Hattangady et al., "Ultrathin Nitrogen–Profile Engineered Gate Dielectric Films," *International Electron Devices Meeting 1996*, Dec. 8–11, 1996, San Francisco, CA, pp. 495–498.

C. T. Liu et al, "High Performance 0.2 µm CMOS with 25 Å Gate Oxide Grown on Nitrogen Implanted Si Subsstrates," *International Electron Devices Meeting Technical Digest*, San Francisco, CA, Dec. 8–11, 1996, pp. 499–502.

C.T. Liu et al., "25 Å Gate Oxide without Boron Penetration for 0.25 and 0.3µm PMOSFETs," *1996 Symposium on VLSI Technology Digest of Technical Papers*, pp. 18–19. Month Unknown.

ion IMPLANTATION INTO A GATE
ELECTRODE LAYER USING AN IMPLANT
PROFILE DISPLACEMENT LAYER

CROSS-REFERENCE TO RELATED APPLICATIONS

This patent document is related to the following concurrently-filed, commonly-assigned, copending U.S. patent application, which is incorporated herein by reference in its entirety:

U.S. patent application Ser. No. (unassigned, Attorney Docket No. M-3983 US), entitled "Composite Gate Electrode Incorporating Dopant Diffusion-Retarding Barrier Layer Adjacent to Underlying Gate Dielectric," naming as inventors Mark I. Gardner, Robert Dawson, H. Jim Fulford, Jr., Frederick Hause, Daniel Kadosh, Mark W. Michael, Bradley T. Moore, and Derick J. Wristers.

BACKGROUND OF THE INVENTION

1. Field of the Invention

The present invention relates to the manufacture of integrated circuit transistor structures, and more particularly to the use of ion implantation for doping a transistor gate electrode layer.

2. Description of the Related Art

Polysilicon is used extensively for the gate electrode of insulated gate field effect transistors (IGFETs), including use in advanced CMOS technologies. Typically a layer of polysilicon is formed on a gate dielectric layer previously formed on a semiconductor body, such as a substrate. The polysilicon is doped with a P-type or N-type dopant, and etched to form a respective gate electrode for each respective transistor. For a CMOS technology, the polysilicon gate electrode layer may be doped with a P-type dopant in certain regions for use as a gate electrode for a P-channel IGFET, and doped with an N-type dopant in other regions for use as a gate electrode for an N-channel IGFET.

As semiconductor technologies have scaled to ever smaller dimensions, it is desirable to also reduce the thickness of a polysilicon gate layer. Several factors warrant the use of a thinner polysilicon layer to form the gate electrodes. First, a thin polysilicon layer is easier to control the etching necessary to define narrow and controllable features, which become the gate electrodes. The width of the gate electrodes define the electrical length of the IGFET, which is a crucial parameter for transistor performance and operating characteristics. The controllability of the polysilicon etch (i.e., the "critical dimension control" or "CD control") is reduced as thickness is increased. Moreover, a thin polysilicon layer is desirable for formation of narrower spacer structures which are necessary for high performance transistor structures. Since the width of a spacer formed adjacent to a gate electrode is a function of the thickness of the polysilicon layer, thinner polysilicon layers allow narrower spacers. Additionally, a more uniform doping of a dopant is achievable as a polysilicon layer becomes thinner. Lastly, a thinner polysilicon layer reduces the vertical dimensions of the structure, and facilitates planarization issues or metal step coverage concerns.

However, as polysilicon layers become thinner, they become harder to dope using ion-implantation. Modern ion implantation equipment, when used in a production environment, requires an extraction energy from the implant source in the range from 15–25 KeV. An implanter using an energy below this range is usually unable to extract a significant number of ions from the implanter source, and is therefore unable to implant any dopant atoms into the semiconductor work piece. Even when using an acceleration energy as low as possible, the dopant atoms may penetrate through a thin poly layer. This is especially true when implanting boron, which is a relatively light, highly-diffusive atom, into a thin polysilicon layer. The boron may all to easily penetrate through the polysilicon layer and become implanted in either the gate dielectric layer (e.g., a "gate oxide" layer) or even into the channel region of the IGFET disposed below the gate dielectric layer. Such a penetration has disastrous effects on both threshold control of the transistor and on the reliability of the transistor. Phosphorus is used as a frequent N-type dopant, and although heavier than boron, still may exhibit the same penetration effects at slightly different energies or polysilicon layer thicknesses.

Current technology then limits the thickness of a polysilicon layer to a value much thicker than desired, or risk the penetration of dopants, especially boron, into the oxide or channel. What is needed is a production-worthy technique for doping polysilicon layers of ever decreasing thickness without risk of implanting dopants into underlying layers. Without such a technique, the advantages of thin polysilicon layers cannot be easily achieved.

SUMMARY OF THE INVENTION

The present invention provides a method for implanting a dopant into a thin gate electrode layer by forming a displacement layer on the gate electrode layer to form a combined displacement/gate electrode layer, and implanting into the combined layer. The displacement layer is ultimately removed, leaving at least some portion of the implanted dopant within the gate electrode layer.

The gate electrode layer may be implanted before or after patterning and etching the gate electrode layer to define gate electrodes. Moreover, two different selective implants may be used to define separate regions of differing dopant concentration, such as P-type polysilicon and N-type polysilicon regions. Each region may utilize a displacement layer having an independent thickness, which allows dopants of different atomic mass to use similar implant energies.

In one embodiment, a method of forming a gate electrode for an insulated gate field effect transistor (IGFET) includes the steps of: (1) providing a gate dielectric layer on an underlying semiconductor body; (2) forming a gate electrode layer on the gate dielectric layer; (3) forming a displacement layer on the gate electrode layer to form a combined displacement/gate electrode layer; (4) implanting a first material into the combined displacement/gate electrode layer to form an implant profile of the first material within at least the gate electrode layer; and (5) removing regions of the combined displacement/gate electrode layer to form a gate electrode in remaining regions.

In some embodiments, the first material implant profile substantially resides entirely within the gate electrode layer. In others, it substantially resides partially within the gate electrode layer and partially within the displacement layer. In still others, the method may include the step of removing the displacement layer after the first material implanting step.

The first material implanting step may be performed non-selectively into the combined displacement layer/gate electrode layer. In another embodiment, it may be performed selectively into a first region of the combined displacement layer/gate electrode layer. In some embodiments, the method may include selectively implanting a second material into a second region of the combined displacement layer/gate electrode layer different from the first region, to form an implant profile of the second material within at least the gate electrode layer.

The displacement layer may comprise a silicon-containing layer chosen from the group consisting of silicon nitride and polysilicon, an oxide-containing layer chosen from the group consisting of silicon oxide, silicon oxynitride, nitrogen-containing silicon oxide, nitrogen-containing silicon oxynitride, and tetraethylorthosilicate (TEOS), or a polymer-based layer such as a photoresist layer. In some embodiments, the displacement layer may also include an etch-stop layer formed between a silicon-containing layer and the gate electrode layer.

In another embodiment of the present invention, a method of forming a gate electrode for an insulated gate field effect transistor (IGFET) includes the steps of: (1) providing a gate dielectric layer on an underlying semiconductor body; (2) forming a polysilicon gate electrode layer having a thickness on the gate dielectric layer; (3) forming a displacement layer having a thickness on the gate electrode layer to form a combined displacement/gate electrode layer; (4) implanting a first material into a first region of the combined displacement/gate electrode layer to form therewithin an implant profile of the first material within at least the gate electrode layer; (5) implanting a second material into a second region of the combined displacement layer/gate electrode layer, to form therewithin an implant profile of the second material within at least the gate electrode layer; and (6) removing regions of the combined displacement/gate electrode layer to form a first gate electrode within the first region and a second gate electrode within the second region.

In certain embodiments the method includes etching, after the gate electrode layer forming step, the gate electrode layer within the first region to reduce its thickness.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items. To improve clarity and understanding, the figures are not necessarily drawn to scale.

DETAILED DESCRIPTION OF THE PREFERRED EMBODIMENTS

Figure 1A:
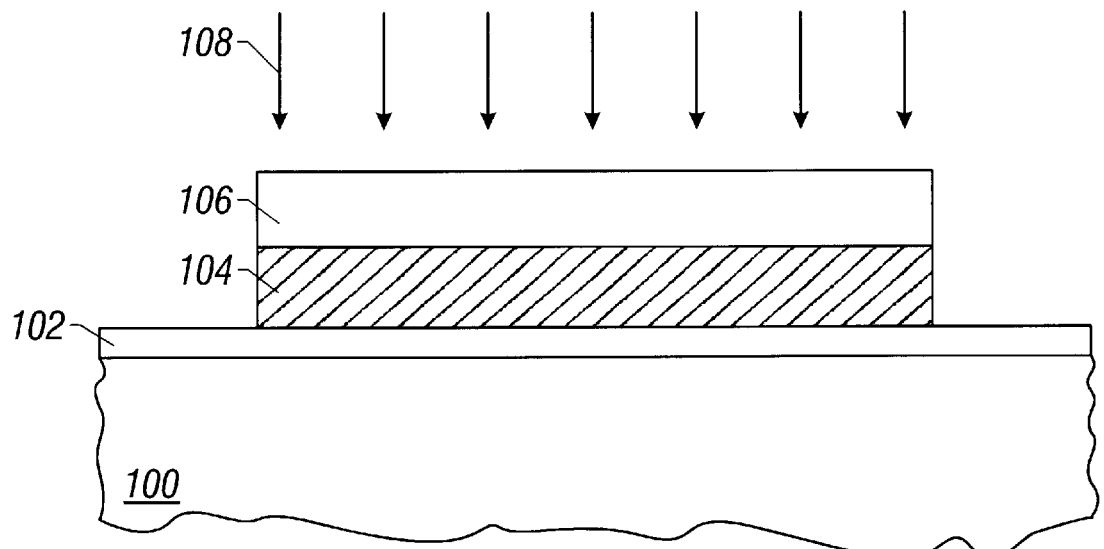
FIGS. 1A, 1C are cross-sectional views of a semiconductor process flow in accordance with an embodiment of the current invention, utilizing a non-selective implant through a displacement layer into a gate electrode layer.
Figure 1B:
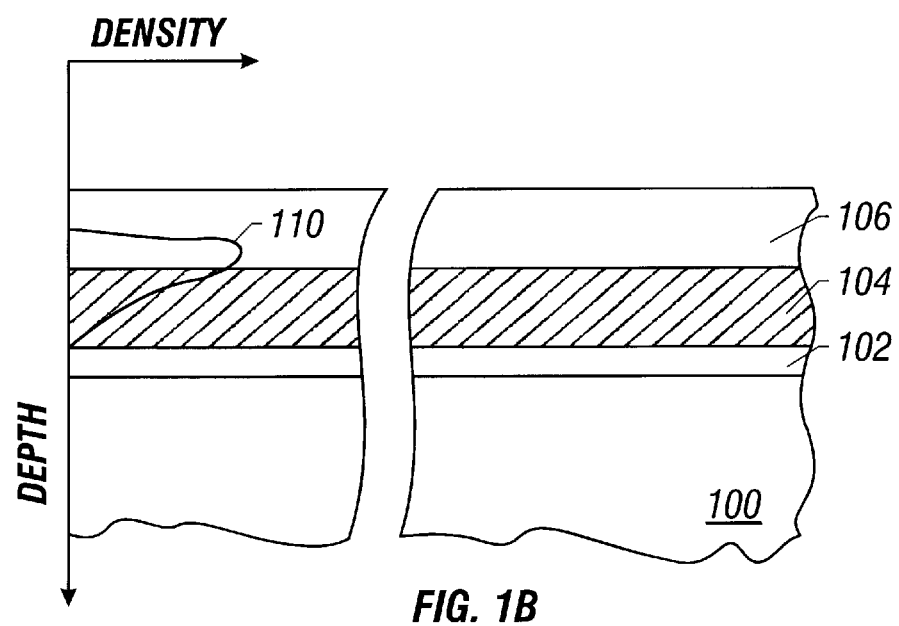
FIG. 1B is a cross-sectional view of a doping profile for the embodiment shown in FIGS. 1A–1C.
Figure 1C:
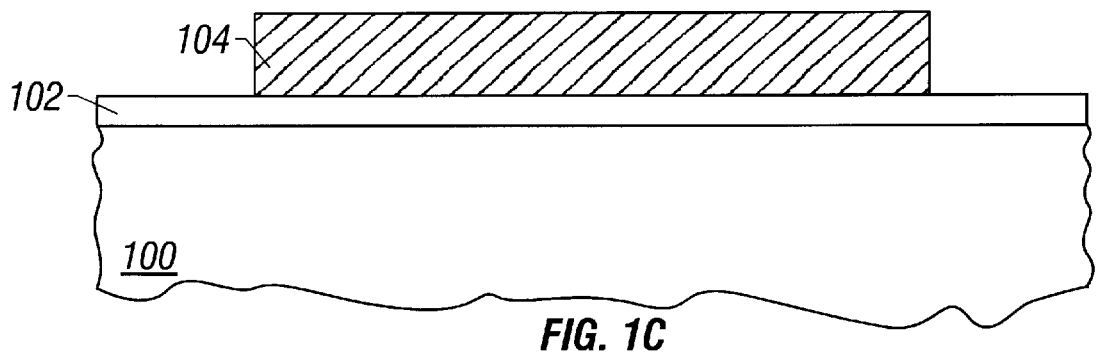

One embodiment of the present invention is illustrated in FIGS. 1A–1C in which a displacement layer is used on a gate electrode layer to control the depth of an implant and the resulting location of the implant profile.

FIG. 1A shows a semiconductor substrate 100 which may include N-well regions, P-well regions, epitaxial layers, and any of a variety of structures (not shown). A gate dielectric layer 102 is formed on the semiconductor substrate 100. Techniques for forming the gate dielectric layer 102 are well known in the art and are not discussed in detail herein. The gate dielectric layer 102 is preferably 30–200 Å thick, and may be formed using a silicon oxide, silicon oxynitride, or another suitable compound. A polysilicon gate electrode layer 104 is formed on the gate dielectric layer 102, and a displacement layer 106 is then formed on the polysilicon gate electrode layer 104. The polysilicon gate layer 104 is preferably 200–2500 Å thick. Techniques for forming the gate electrode layer 104 are well known in the art and are not discussed in detail herein. Additional techniques for forming advantageous gate electrode layers are discussed in copending U.S. Application Serial Number (unassigned, Attorney Docket Number M-3983 US) entitled "Composite Gate Electrode Incorporating Dopant Diffusion-Retarding Barrier Layer Adjacent to Underlying Gate Dielectric," already incorporated by reference herein. The displacement layer 106 is preferably formed (for this embodiment) of a silicon oxide or silicon oxynitride layer having a thickness in the range of 100–4000 Å. Other compositions of the displacement layer 106 are also useful, including silicon nitride and polymer-based layers such as photoresist.

Continuing with the process sequence, a boron implant 108 is next performed non-selectively (as an unmasked, or "blanket" implant) into the semiconductor body as shown in FIG. 1A. The resulting structure is shown in FIG. 1B, which illustrates the doping profile 110 achieved by the previous boron implant 108. The doping profile 110, for this embodiment, extends partially within the displacement layer 106 and partially within the polysilicon gate electrode layer 104. The boron implant 108 is preferably performed (for a 30 Å thick silicon dioxide displacement layer 106) at an energy in the range of 5–25 KeV at a dose in the range from $1\times10^{15}$–$5\times10^{15}$ atoms/cm$^2$, to achieve the placement of the doping profile at a depth in the range from $0.01\mu$ to $0.05\mu$. Other combinations of implant energy, displacement layer 106 composition and thickness, and polysilicon gate electrode layer 104 thickness are possible to select the vertical depth and contour of the doping profile. For example, the placement of the doping profile may be located entirely within the polysilicon gate layer 104, especially if the polysilicon gate layer 104 is somewhat thicker than 200 Å.

The boron implant 108 may represent the heavy source/drain implant performed after a gate electrode layer is patterned to form gate electrodes. Depending on the material chosen, the displacement layer 106 may or may not be removed. For example, a silicon dioxide displacement layer need not necessarily be removed before subsequent processing. Alternatively, the boron implant 108 may represent a polysilicon layer doping implant occurring prior to gate electrode patterning and formation. If so, the displacement layer 106 is then removed, resulting in the structure as shown in FIG. 1C. The polysilicon gate electrode layer 104 is doped with boron, achieved by using an implant energy which traditionally would have resulted in boron penetration through the polysilicon gate electrode layer 104 and into the gate dielectric layer 102. Continuing with the process sequence, a photoresist layer (not shown) is next applied and a gate mask used to image the gate electrode features into the photoresist. The polysilicon gate electrode layer 104 is then anisotropically etched to define a gate electrode (not shown). A light dose of a first dopant (e.g., boron) is implanted (not shown) into the semiconductor substrate 100 to provide a lightly doped source and drain regions, and spacers are then formed at the edges of the gate electrode, and a heavy implant is performed to form source and drain regions (not shown) and to (optionally) more-heavily dope the gate electrode.

Further processing steps in the fabrication of IGFETs typically include forming a thick oxide layer over the active regions, forming contact windows in the oxide layer above the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

Figure 2:
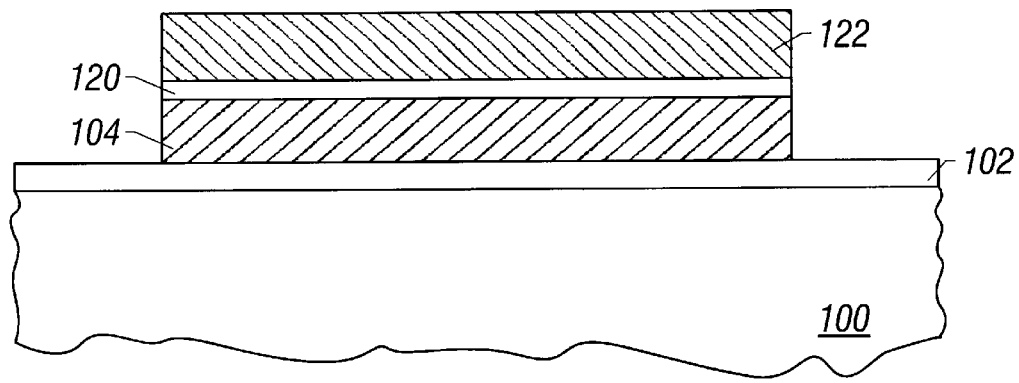
FIG. 2 is a cross-sectional view of one state within a semiconductor process flow in accordance with an embodiment of the current invention utilizing a displacement layer having an etch stop layer formed on the gate electrode layer.

Referring now to FIG. 2, an alternate embodiment of a displacement layer is shown which includes an oxide layer 120 formed between the polysilicon gate electrode layer 104 and a silicon nitride layer 122. Together the oxide layer 120 and the silicon nitride layer 122 function as a displacement layer as described above. The oxide layer 120 functions as an etch stop layer to facilitate subsequent removal of the silicon nitride layer 122 after implantation of the desired dopant into the gate electrode layer 104. The oxide layer 120 is preferably 30–60 Å thick, although other thicknesses are also workable. Suitable thicknesses for the silicon nitride layer 122 may be computed from implant range statistics for the desired ion to be implanted.

An alternate embodiment of the present invention is shown which forms separate N-channel and P-channel polysilicon regions using a split-level displacement layer. Referring now to FIGS. 3A–3D, a semiconductor substrate 100, a gate dielectric layer 102 formed on the semiconductor substrate 100, and a gate electrode layer 104 are formed as before. A displacement layer 130 is formed on the top surface of the gate electrode layer 104.

Figure 3A:
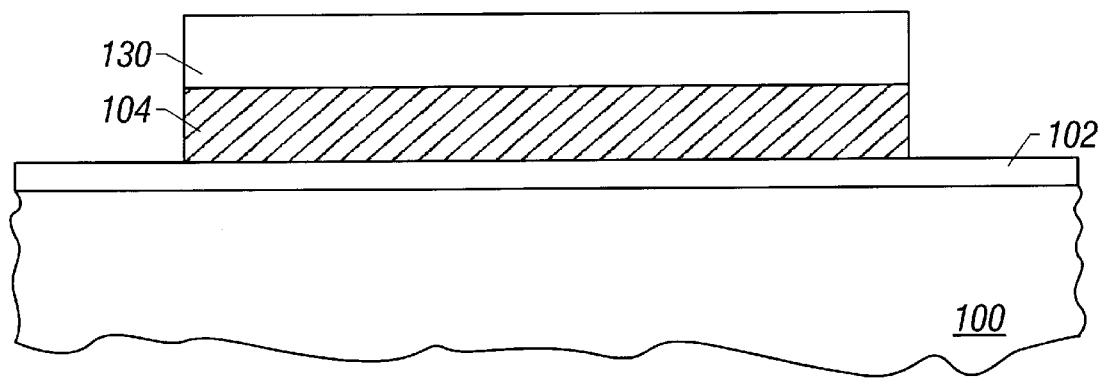
FIGS. 3A–3D are cross-sectional views of a semiconductor process flow in accordance with another embodiment of the current invention utilizing a selective implant into a first region of the gate electrode layer and different selective implant into a second region of the gate electrode layer.
Figure 3B:
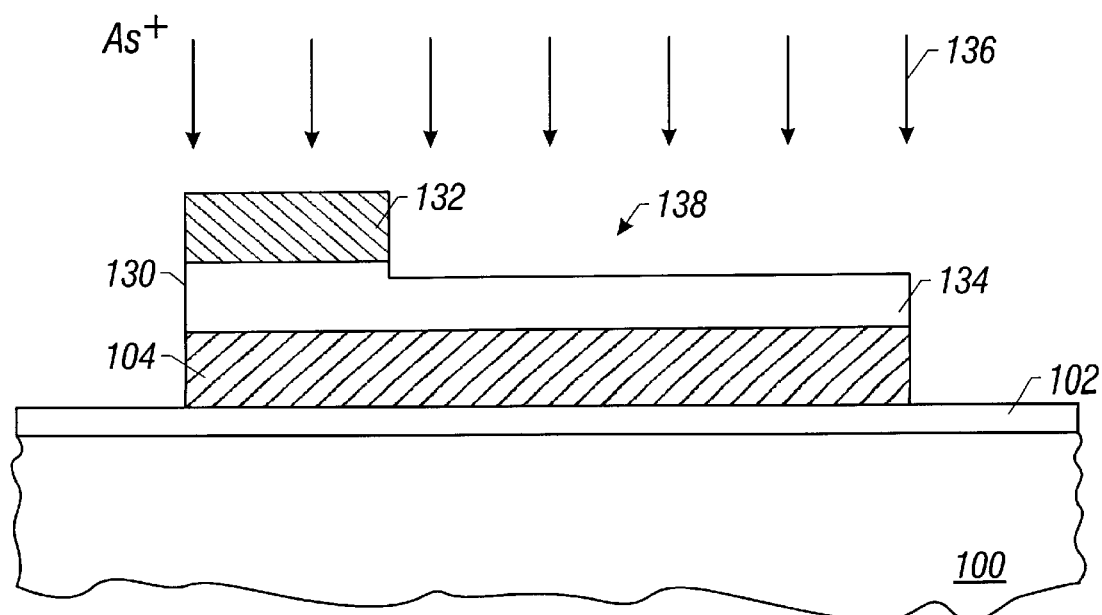

Continuing with the process sequence, a masking layer is then applied and patterned to expose a region of the displacement layer 130, which is then etched to thin the displacement layer within the exposed region. The resulting structure is shown in FIG. 3B, which shows a patterned masking layer 132 exposing a region 138 of the displacement layer 130, and shows a partially-etched displacement layer portion 134 having a reduced thickness compared to the original thickness of the displacement layer 130. An arsenic implant 136 is then performed to create a doping profile of arsenic located vertically within at least the gate electrode layer 104, and located horizontally within the region 138. The masking layer 132 is formed thick enough to block the arsenic implant 136 from reaching the gate electrode layer 104 in regions other than region 138.

Figure 3C:
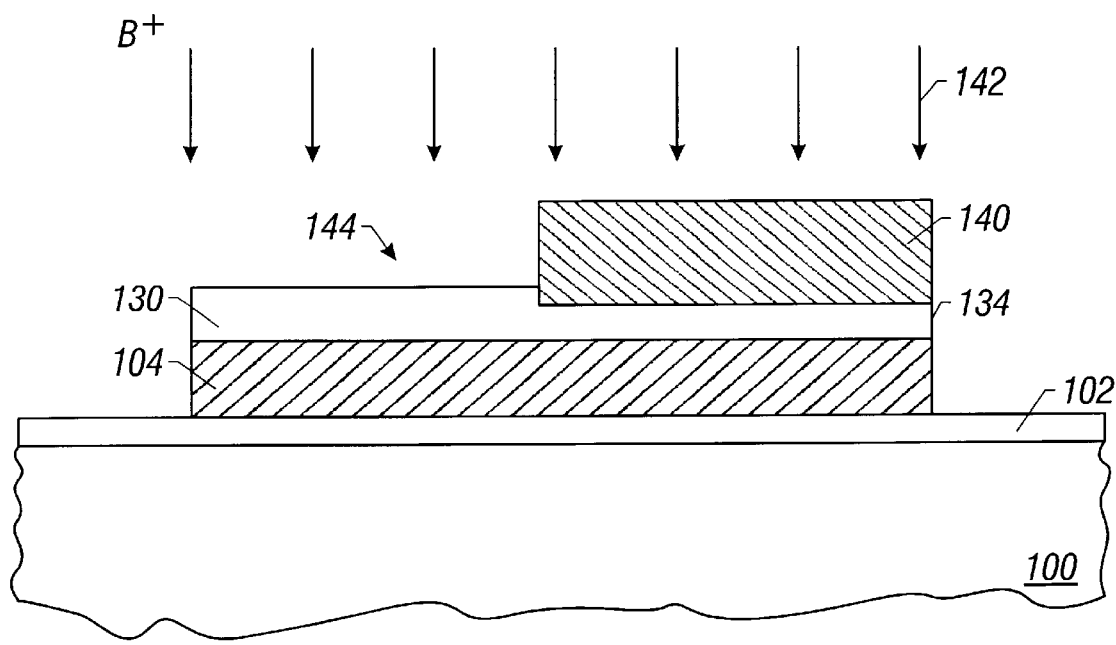

Continuing with the process sequence, the patterned masking layer 132 is then removed, and a second masking layer is then applied and patterned to expose a separate region of the displacement layer 130 (e.g., remaining regions other than region 138). The resulting structure is shown in FIG. 3C, which shows a patterned masking layer 140 exposing a region 144 of the displacement layer 130. The partially-etched displacement layer portion 134 is now protected by the patterned masking layer 140. A boron implant 142 is then performed into the exposed region of the combined displacement/gate electrode layer to create a doping profile of boron located vertically within at least the gate electrode layer 104, and located horizontally within the region 144. The masking layer 140 is formed thick enough to block the boron implant 142 from reaching the gate electrode layer 104 in regions other than region 144. The increased thickness of the displacement layer 130, compared to the partially-etched displacement layer portion 134, is helpful in providing for appropriately greater implant ranges (for similar implant energy) for the boron implant 142, which has a lighter atomic mass than arsenic.

Figure 3D:
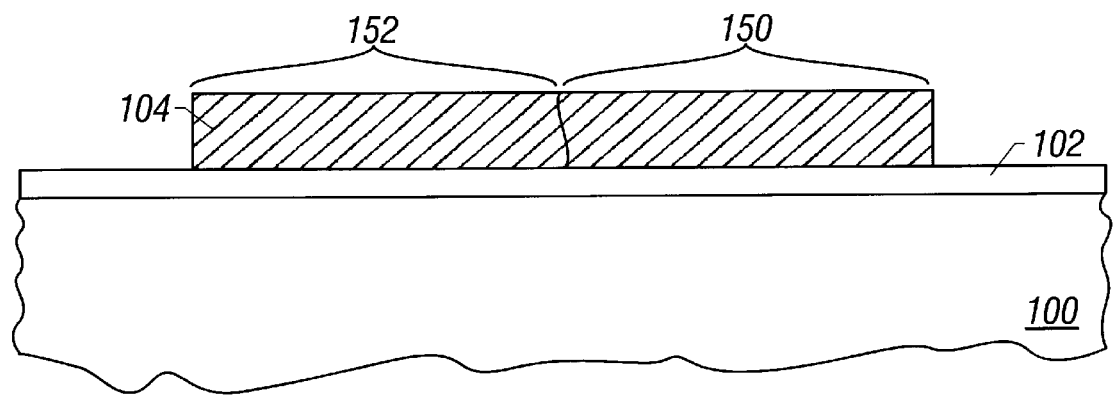

Continuing with the process sequence, the patterned masking layer 140 is then removed, and the displacement layer 130 (as well as the partially-etched displacement layer portion 134) is removed. The resulting structure is shown in FIG. 3D, which shows a P-type region 150 and an N-type region 152 formed within the gate electrode layer 104. As before, a doping profile within the gate electrode layer 104 is achieved by using an implant energy which traditionally would have resulted in boron (and possibly arsenic) penetration through the polysilicon gate electrode layer 104 and into the gate dielectric layer 102.

Figure 4A:
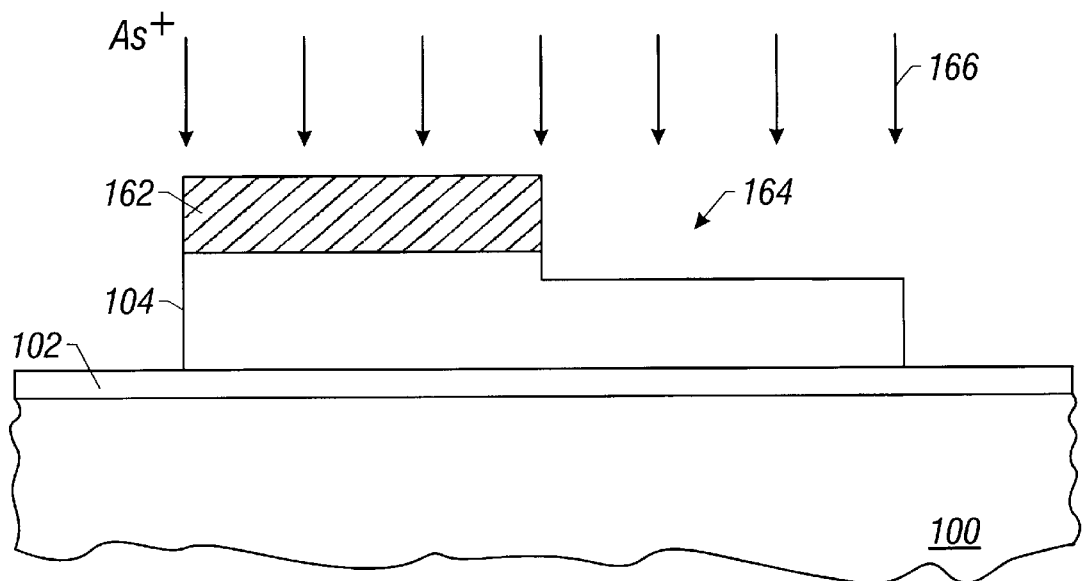
FIGS. 4A–4C are cross-sectional views of a semiconductor process flow in accordance with yet another embodiment of the current invention utilizing a selective implant into a first region of the gate layer and another selective implant into a second region of the gate layer, and utilizing polysilicon as a displacement layer.

An additional embodiment of the present invention is shown which forms separate N-channel and P-channel polysilicon regions using a split-level gate electrode layer. Referring now to FIG. 4A, a semiconductor substrate 100, a gate dielectric layer 102 formed on the semiconductor substrate 100, and a gate electrode layer 104 are formed as before.

Continuing with the process sequence, a masking layer is then applied and patterned to expose a region of the gate electrode layer 104, which is then etched to reduce its thickness within the exposed region. The resulting structure is shown in FIG. 4A, which shows a patterned masking layer 162 exposing a region 164 of the gate electrode layer 104 having a reduced thickness compared to its original thickness. An arsenic implant 136 is then performed to create a doping profile of arsenic located vertically within at least the gate electrode layer 104 near the top surface of the lower dielectric layer 102, and located horizontally within the region 164. The masking layer 162 blocks the arsenic implant 136 from reaching the lower portions of the gate electrode layer 104 in regions other than region 164.

Figure 4B:
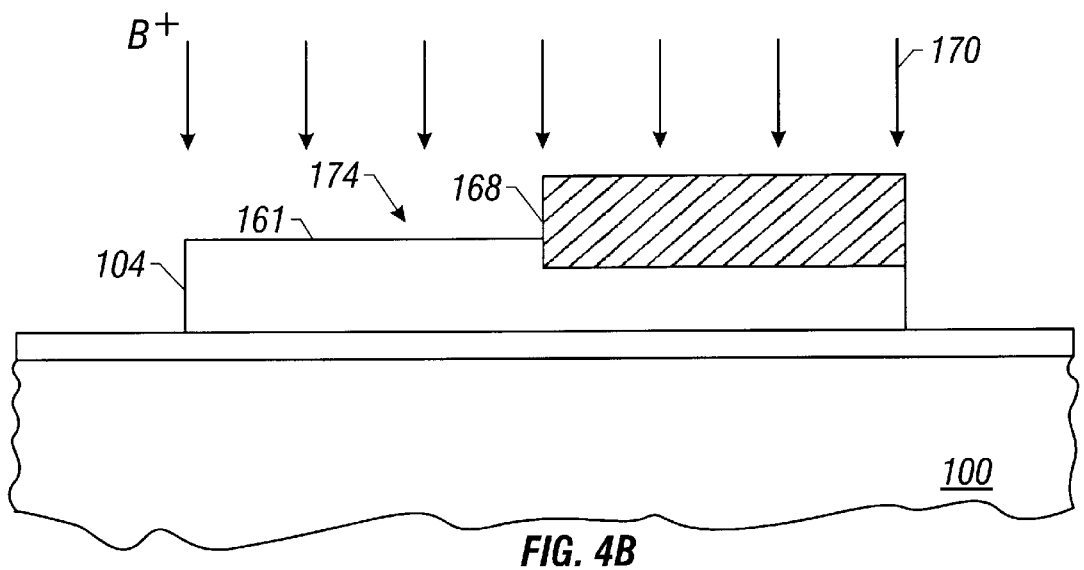
Figure 4C:
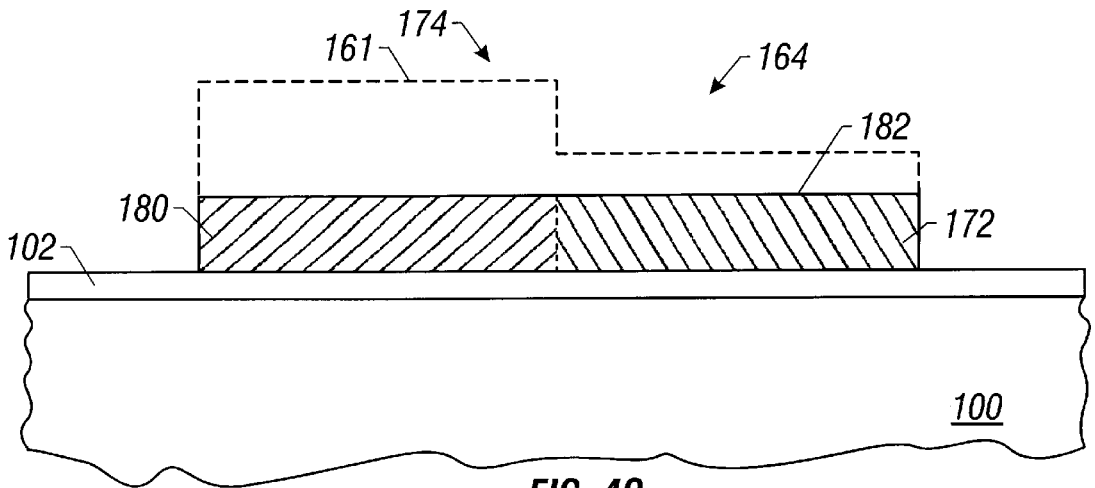

Continuing with the process sequence, the patterned masking layer 162 is then removed, and a second masking layer is then applied and patterned to expose a separate region of the gate electrode layer 104 (e.g., remaining regions other than region 164). The resulting structure is shown in FIG. 4B, which shows a patterned masking layer 168 exposing a region 174 of the gate electrode layer 104. The partially-etched portion of the gate electrode layer 104 disposed within region 164 is now protected by the patterned masking layer 168. A boron implant 170 is then performed into the exposed region 174 of the gate electrode layer to create a doping profile of boron located vertically within at least the lower portions of the gate electrode layer 104, and located horizontally within the region 174. The masking layer 170 is formed thick enough to block the boron implant 142 from reaching the gate electrode layer 104 in regions other than region 174. Upper portions of the gate electrode layer 104 behave as a displacement layer for the implantation steps. The increased thickness of the gate electrode layer 104 within region 174, compared to the thickness within region 164, compensates for the greater implant range of boron compared to arsenic (for similar implant energy).

Continuing with the process sequence, the patterned masking layer 168 is then removed, and the upper portions of the gate electrode layer 104 are removed to create an etched gate electrode layer 172. The resulting structure is shown in FIG. 3D, which shows a P-type region 180 formed vertically within the etched gate electrode layer 172 and formed horizontally within the region 174. An N-type region 182 is formed vertically within the etched gate electrode layer 172 and formed horizontally within the region 164. As before, a doping profile within a thin gate electrode layer 104 is achieved by using an implant energy which traditionally would have resulted in dopant penetration through a polysilicon layer as thin as the etched gate electrode layer 172.

Figure 5A:
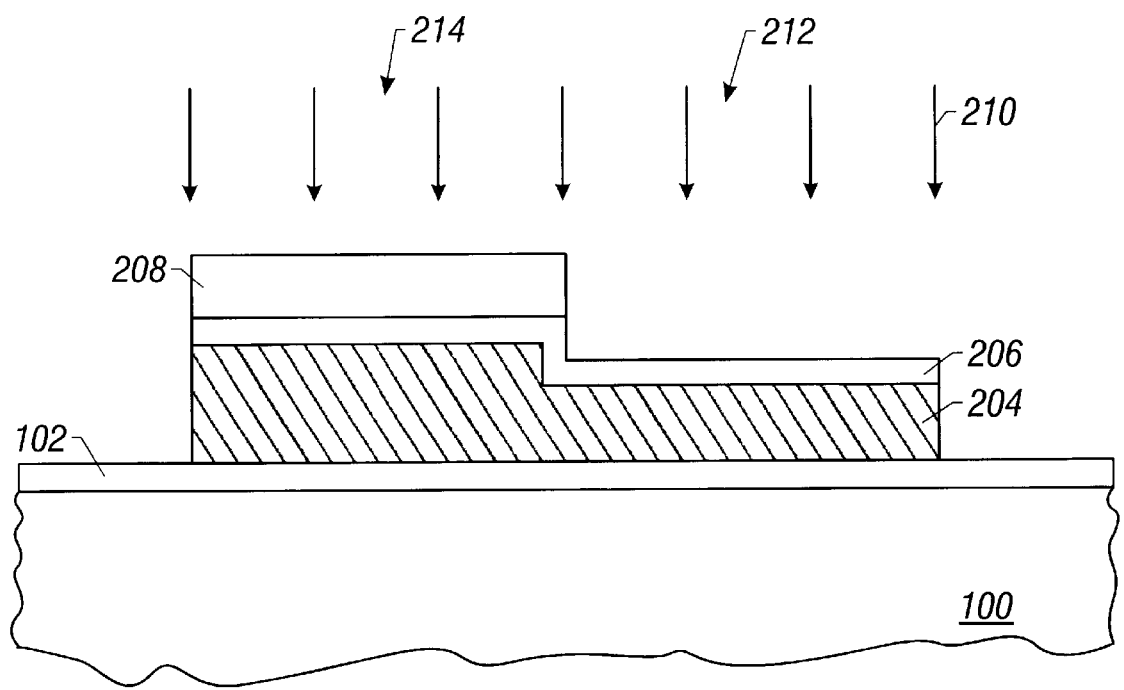
FIGS. 5A is a cross-sectional view of one state within a semiconductor process flow in accordance with yet another embodiment of the current invention utilizing selective implants through a displacement layer into first and second regions of the gate electrode layer, and utilizing different thicknesses of the gate electrode layer in the respective regions.

An additional embodiment of the present invention is shown which utilizes a separate displacement layer overlying a split-level gate electrode layer. Referring now to FIGS. 5A, a semiconductor substrate 100, a gate dielectric layer 102 formed on the semiconductor substrate 100, and a gate electrode layer 104 are formed as before.

Continuing with the process sequence, a masking layer (not shown) is then applied and patterned to expose a region 212 of the gate electrode layer 104, which is then etched to reduce its thickness within the exposed region. A displacement layer 206 is then formed on the surface of the split-level gate electrode layer 204, and a masking layer is then applied and patterned to expose region 212 of the displacement layer 206. The resulting structure is shown in FIG. 5A, which shows a patterned masking layer 208 exposing a region 212 of the displacement layer 206. An implant 210 is then performed to create a doping profile located vertically within at least the gate electrode layer 204, and located horizontally within the region 212. The patterned masking layer 208 is then removed, and a second masking layer is then applied and patterned to expose a separate region of the displacement layer 206, analogously to that described above. A second dopant implant (not shown) is then performed into region 214, the second patterned masking layer is removed, and the displacement layer optionally removed.

By use of this invention, thin layers of polysilicon may be used to form a gate electrode layer and may be doped to adequate doping densities while using production-worthy implant energies, rather than uncontrollably low energies. The gate dielectric layer may be reduced down to approximately 25 Å, without significant concentration of boron reaching the gate dielectric.

Although only a single P-type region and a single N-type region has been shown within a polysilicon layer for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular transistor process technology, or to any particular layer thickness or composition. Moreover, while gate dielectrics are commonly formed of silicon dioxide, such a gate dielectric layer 102 in the above embodiments may be formed of a silicon oxynitride, a silicon nitride, or any other suitable insulating material which may be formed in an appropriate thickness. Moreover, while certain embodiments have been described in the context of a P-channel IGFET, it should be appreciated that such detailed process descriptions are analogously applicable for N-channel IGFET fabrication.

A boron implant step may utilize B, BF, $BF_2$, or any other source containing boron atoms such as $BF_x$, and any nitrogen implant step described may utilize atomic nitrogen (N), molecular nitrogen ($N_2$), or any other source containing nitrogen atoms. A given implant may be restricted to forming a corresponding layer within a certain region (for example, such as a P-channel gate electrode) and excluding other regions (for example, such as an N-channel gate electrode). As another example, a given implant step described above may be performed using two different implant operations, each at a different energy, to achieve a wider doping profile than achievable using a single implant. Accordingly, other embodiments, variations, and improvements not described herein are not necessarily excluded from the scope of the invention, which is defined by the following appended claims.

What is claimed is:

1. In a semiconductor process, a method of forming a gate electrode for an insulated gate field effect transistor (IGFET), said method comprising the steps of:

providing a gate dielectric layer on an underlying semiconductor body;

forming a gate electrode layer on the gate dielectric layer;

forming a displacement layer on the gate electrode layer to form a combined displacement/gate electrode layer;

implanting a first material into the combined displacement/gate electrode layer to form an implant profile of the first material within at least the gate electrode layer; and removing regions of the combined displacement/gate electrode layer to form a gate electrode in remaining regions.

2. A method as in claim 1 wherein:

the removing step is performed before the first material implanting step; and the first material implanting step is performed into the remaining regions of the combined displacement/gate electrode layer which form the gate electrode.

3. A method as in claim 1 further comprising the step of:

removing the entire displacement layer after the first material implanting step.

4. A method as in claim 1 wherein:

the first material implant profile substantially resides entirely within the gate electrode layer.

5. A method as in claim 1 wherein:
the first material implant profile substantially resides partially within the gate electrode layer and partially within the displacement layer.

6. A method as in claim 1 wherein:
the first material implant profile substantially resides partially within the gate electrode layer and partially within the displacement layer; and
the method further comprises the step of removing the displacement layer after the first material implanting step.

7. A method as in claim 1 wherein:
the first material implanting step is performed non-selectively into the combined displacement layer/gate electrode layer.

8. A method as in claim 1 wherein:
the implanting step is performed selectively into a first region of the combined displacement layer/gate electrode layer.

9. A method as in claim 8 further comprising the step of:
selectively implanting a second material into a second region of the combined displacement layer/gate electrode layer different from the first region, to form an implant profile of the second material within at least the gate electrode layer.

10. A method as in claim 1 wherein the displacement layer comprises:
a silicon-containing layer chosen from the group consisting of silicon nitride and polysilicon.

11. A method as in claim 1 wherein the displacement layer comprises:
an oxide-containing layer chosen from the group consisting of silicon oxide, silicon oxynitride, nitrogen-containing silicon oxide, nitrogen-containing silicon oxynitride, and tetraethylorthosilicate (TEOS).

12. A method as in claim 1 wherein the displacement layer comprises:
a polymer-based layer.

13. A method as in claim 1 wherein the displacement layer comprises:
a silicon-containing layer chosen from the group consisting of silicon nitride and polysilicon;
an etch-stop layer formed between the silicon-containing layer and the gate electrode layer.

14. A method as in claim 1 wherein:
the first material is chosen from the group consisting of an N-type dopant, a P-type dopant, and a nitrogen-containing material; and
the gate electrode layer comprises a polysilicon-based layer.

15. In a semiconductor process, a method of forming gate electrodes suitable for insulated gate field effect transistors (IGFET), said method comprising the steps of:
providing a gate dielectric layer on an underlying semiconductor body;
forming a polysilicon gate electrode layer having a thickness on the gate dielectric layer;
forming a displacement layer having a thickness on the gate electrode layer to form a combined displacement/gate electrode layer;
implanting a first material into a first region of the combined displacement/gate electrode layer to form therewithin an implant profile of the first material within at least the gate electrode layer;
implanting a second material into a second region of the combined displacement layer/gate electrode layer, to form therewithin an implant profile of the second material within at least the gate electrode layer;
removing regions of the combined displacement/gate electrode layer to form a first gate electrode within the first region and a second gate electrode within the second region.

16. A method as in claim 15 further comprising the step of:
masking, before the first material implanting step, the combined displacement layer/gate electrode layer to expose the first region thereof and to protect remaining regions thereof.

17. A method as in claim 16 further comprising the step of:
masking, before the second material implanting step, the combined displacement layer/gate electrode layer to expose the second region thereof and to protect remaining regions thereof.

18. A method as in claim 15 wherein:
the first material comprises arsenic; and
the second material comprises a boron-containing material.

19. A method as in claim 18 wherein:
the thickness of the gate electrode layer is between approximately 200 Å and 2500 Å;
the first material implant profile substantially resides partially within the displacement layer and partially within the gate electrode layer; and
the second material implant profile substantially resides partially within the displacement layer and partially within the gate electrode layer.

20. A method as in claim 16 further comprising the step of:
etching, before the first material implanting step, the displacement layer within the exposed first region to reduce its thickness.

21. A method as in claim 15 further comprising the step of:
removing the displacement layer after the second material implanting step.

22. A method as in claim 20 wherein the displacement layer comprises:
an oxide-containing layer chosen from the group consisting of silicon oxide, silicon oxynitride, nitrogen-containing silicon oxide, nitrogen-containing silicon oxynitride, and tetraethylorthosilicate (TEOS).

23. A method as in claim 20 wherein the displacement layer comprises:
an etch-stop layer formed on the gate electrode layer; and
a silicon-containing layer formed on the etch-stop layer, said silicon-containing layer chosen from the group consisting of silicon nitride and polysilicon.

24. A method as in claim 23 wherein the etch-stop layer comprises:
a material chosen from the group consisting of silicon oxide and silicon oxynitride.

25. A method as in claim 23 wherein the etch-stop layer has a thickness in the approximate range from 30–200 Å.

26. A method as in claim 19 wherein:
the combined displacement layer/gate electrode layer is formed to a thickness between approximately 2000 and 2500 Å.

27. A method as in claim 19 wherein:
the first and second material implanting steps are performed using an acceleration energy within the approximate range of 5–25 KeV.

28. A method as in claim 15 further comprising the step of:
etching, after the gate electrode layer forming step, the gate electrode layer within the first region to reduce its thickness.

29. A method as in claim 15 further comprising the step of:
removing the displacement layer after the second material implanting step;
wherein the gate electrode layer comprises a lower portion of a particular polysilicon layer; and
wherein the displacement layer comprises an upper portion of the particular polysilicon layer.

30. In a semiconductor process, a method of forming gate electrodes suitable for insulated gate field effect transistors (IGFET), said method comprising the steps of:
providing a gate dielectric layer on an underlying semiconductor body;
forming a gate electrode layer on the gate dielectric layer, said gate electrode layer having a first thickness within a first region and having a second thickness within a second region;
implanting a first material into the first region of the gate electrode layer to form therewithin an implant profile of the first material within at least the gate electrode layer;
implanting a second material into the second region of the gate electrode layer, to form therewithin an implant profile of the second material within at least the gate electrode layer;
removing regions of the gate electrode layer to form a first gate electrode within the first region and a second gate electrode within the second region.

31. A method as in claim 30 further comprising the step of:
forming, before the first material implanting step, a displacement layer having thickness on the gate electrode layer, to form a combined displacement/gate electrode layer; and
wherein the first and second material implanting steps are performed through the displacement layer.

32. A method as in claim 31 further comprising the step of:
masking, before the first material implanting step, the combined displacement layer/gate electrode layer to expose the first region thereof and to protect remaining regions thereof.

33. A method as in claim 32 further comprising the step of:
masking, before the second material implanting step, the combined displacement layer/gate electrode layer to expose the second region thereof and to protect remaining regions thereof.

34. A method as in claim 33 further comprising the step of:
removing the displacement layer after the second material implanting step and before the gate electrode layer removing step.

35. A method as in claim 34 wherein:
the first material comprises arsenic; and
the second material comprises a boron-containing material.

36. A method as in claim 30 further comprising the step of:
removing upper portions of the gate electrode layer to form a thinner gate electrode layer.

37. A method as in claim 30 further comprising the step of:
etching, after the gate electrode layer forming step, the gate electrode layer within the first region to reduce its thickness.

38. A method as in claim 37 further comprising the step of:
removing the displacement layer after the second material implanting step.

* * * * *